United States Patent
Doyle et al.

(10) Patent No.: US 9,226,405 B1
(45) Date of Patent: Dec. 29, 2015

(54) MAGNETICALLY CONTROLLABLE FLUIDIC ETCHING PROCESS

(71) Applicant: International Business Machines Corporation, Armonk, NY (US)

(72) Inventors: Matthew S. Doyle, Syracuse, NY (US); Joseph Kuczynski, North Port, FL (US); Kevin A. Splittstoesser, Stewartville, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/584,506

(22) Filed: Dec. 29, 2014

Related U.S. Application Data

(63) Continuation of application No. 14/492,130, filed on Sep. 22, 2014.

(51) Int. Cl.
| | | |
|---|---|---|
| *H05K 3/06* | (2006.01) | |
| *C09K 13/00* | (2006.01) | |
| *C09K 13/12* | (2006.01) | |
| *H01F 1/44* | (2006.01) | |

(52) U.S. Cl.
CPC .............. *H05K 3/067* (2013.01); *C09K 13/00* (2013.01); *C09K 13/12* (2013.01); *H01F 1/442* (2013.01); *H05K 2203/0323* (2013.01); *H05K 2203/104* (2013.01); *H05K 2203/125* (2013.01)

(58) Field of Classification Search
None
See application file for complete search history.

(56) References Cited

U.S. PATENT DOCUMENTS

| | | | | |
|---|---|---|---|---|
| 5,786,040 A | * | 7/1998 | Leddy et al. | 427/598 |
| 5,871,625 A | * | 2/1999 | Leddy et al. | 204/290.06 |
| 6,332,829 B1 | * | 12/2001 | Trommer | 451/28 |
| 7,610,074 B2 | * | 10/2009 | Boppart et al. | 600/407 |
| 7,981,688 B2 | * | 7/2011 | Stayton et al. | 436/149 |
| 8,052,860 B1 | * | 11/2011 | Engelhaupt et al. | 205/641 |
| 8,193,102 B2 | * | 6/2012 | Mason et al. | 438/778 |
| 8,283,308 B2 | * | 10/2012 | Mason et al. | 514/1.1 |
| 8,337,979 B2 | * | 12/2012 | Wardle et al. | 428/297.4 |

(Continued)

FOREIGN PATENT DOCUMENTS

| | | |
|---|---|---|
| CN | 102803562 A | 11/2012 |
| WO | 2009029229 A2 | 3/2009 |

(Continued)

OTHER PUBLICATIONS

Blaiszik et al., "Nanocapsules for Self-healing Composites", Proceedings of the 2006 SEM Annual Conference and Exposition on Experimental and Applied Mechanics, 2006.

(Continued)

*Primary Examiner* — Allan Olsen
(74) *Attorney, Agent, or Firm* — Wood, Herron & Evans, LLP; Robert R. Williams

(57) ABSTRACT

The method includes applying a magnetic etching ferrofluid, that contains an aqueous etchant solution within one or more reverse micelles responsive to a magnetic field, onto the substrate at a first depth. The method also includes creating a magnetic field at a first strength that causes the reverse micelle to move in a first direction at a first rate. The method also includes determining whether the substrate is at a second depth. The method also includes reducing, in response to the substrate being at a second depth, the magnetic field to a second strength to cause the reverse micelle to move in the first direction at a second rate.

14 Claims, 4 Drawing Sheets

(56) References Cited

U.S. PATENT DOCUMENTS

| | | | |
|---|---|---|---|
| 8,426,082 B2 | 4/2013 | Yellen et al. | |
| 8,696,955 B2* | 4/2014 | Xia et al. | 264/28 |
| 2002/0042244 A1* | 4/2002 | Trommer | 451/41 |
| 2005/0183740 A1* | 8/2005 | Fulton et al. | 134/3 |
| 2011/0236948 A1 | 9/2011 | Naaman et al. | |
| 2012/0249375 A1 | 10/2012 | Heino et al. | |

FOREIGN PATENT DOCUMENTS

| | | |
|---|---|---|
| WO | 2010061378 A2 | 6/2010 |
| WO | 2010061378 A3 | 6/2010 |
| WO | 2012057878 A1 | 5/2012 |
| WO | 2013056186 A1 | 4/2013 |

OTHER PUBLICATIONS

Blaiszik et al., "Nanocapsules for self-healing materials", Composites Science and Technology, 68 (2008) 978-986, Received Apr. 10, 2007, Published Aug. 8, 2007, © 2007 Elsevier Ltd. DOI: 10.1016/j.compscitech.2007.07.021.

Dietz, K., "Tech Talk: Fine Lines in High Yield (Part CLX), Fine Line Etching Revisited (Part B)", for CircuiTree Magazine, Jan. 2009, DuPont. http://www2.dupont.com/Imaging_Materials/en_US/assets/downloads/techtalk/TT0109.pdf.

Grant, A., "Under magnet's sway, fluids form simple structures", Science News, Jul. 18, 2013, (magazine issue Aug. 10, 2013), © Society for Science & the Public 2010-2013, Washington, DC. www.sciencenews.org/view/generic/id/351715/description/News_in_Brief_Under_magnets_sway_fluids_form_simple_structures.

Gray, R.J., "Magnetic Etching with Ferrofluid", Metallographic Specimen Preparation, J.L. McCall et al (eds.), 1974, pp. 155-177, Springer US, Springer-Verlag US. DOI: 10.1007/978-1-4615-8708_11.

Parent et al., "Influence of surfactant structure on reverse micelle size and charge for non-polar electrophoretic inks", HP Laboratories, HPL-2011-110, Jul. 21, 2011, © Copyright 2011 Hewlett-Packard Development Company, L.P.

Perez et al., "Formation and Morphology of Reverse Micelles Formed by Nonionic Surfactants in "Dry" Organic Solvents", Current Topics in Medicinal Chemistry, 2014, 14, 774-780, © 2014 Bentham Science Publishers.

Rawat et al., "Study of surface morphology of ferrofluid deposited etched ion tracks in dielectric layers", Radiation Measurements, vol. 45, Issue 7, Aug. 2010, pp. 844-849, Copyrights © 2010 Elsevier Ltd.

Shih et al., "Anisotropic copper etching with monoethanolamine-complexed cupric ion solutions", Journal of Applied Electrochemistry, 33:403-410, 2003, © 2003 Kluwer Academic Publishers. http://rd.springer.com/article/10.1023%2FA%3A1024408105251#page-1.

Sliwka, W., "Microencapsulation", Angewandte Chemie International Edition, vol. 14, 1975, No. 8, pp. 539-550. DOI: 10.1002/anie.197505391.

Tiwari et al., "Microencapsulation technique by solvent evaporation method (Study effect of process variables)", International Journal of Pharmacy & Life Sciences (IJPLS), vol. 2, Issue 8, Aug. 2011, pp. 998-1005.

Doyle et al., "Magnetically Controllable Fluidic Etching Process", U.S. Appl. No. 14/492,130, filed Sep. 22, 2014.

List of IBM Patents or Patent Applications Treated as Related.

* cited by examiner

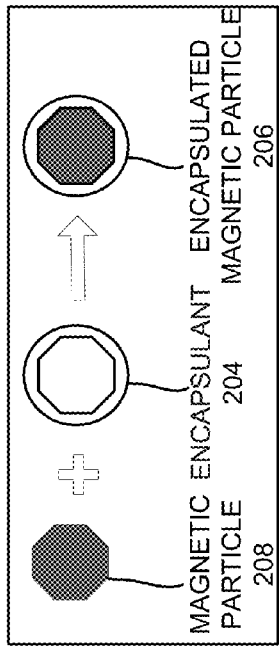
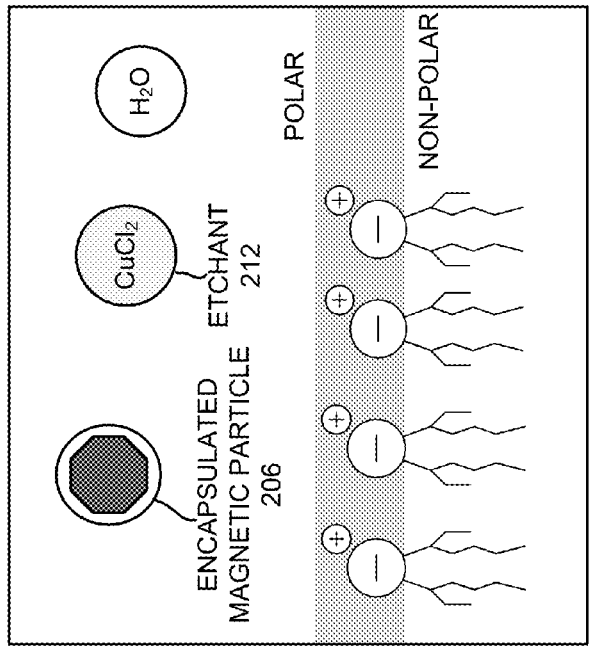
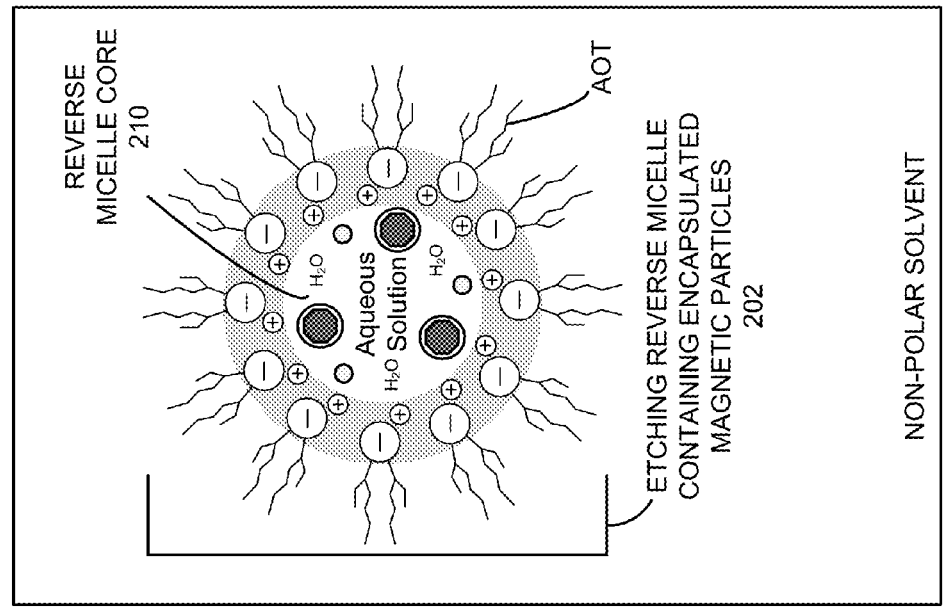

MAGNETICALLY CONTROLLABLE FLUIDIC ETCHING PROCESS

BACKGROUND

The present disclosure relates to etching, and more specifically, to magnetically controllable etching.

Wet etching is a process in which liquid etchants remove a target material from a substrate or wafer in a circuit board. Wet etching can be done anisotropically on crystalline materials, e.g., silicon, by using certain type of etchants. Unlike isotropic etching, anisotropic wet etching allows etchants to etch target material in any direction.

SUMMARY

Embodiments of the present disclosure are directed toward a method and a system for magnetically controllable etching a substrate.

One embodiment is directed toward a method for magnetically controllable etching a substrate. The method includes applying a magnetic etching ferrofluid, that contains an aqueous etchant solution within one or more reverse micelles responsive to a magnetic field, onto the substrate at a first depth. The method also includes creating a magnetic field at a first strength that causes the reverse micelle to move in a first direction at a first rate. The method also includes determining whether the substrate is at a second depth. The method also includes reducing, in response to the substrate being at a second depth, the magnetic field to a second strength to cause the reverse micelle to move in the first direction at a second rate.

Another embodiment is directed toward a system for magnetically controllable etching a substrate. The system may include a substrate with a first depth. The system may also include a monitoring module configured to monitor a structure of the substrate. The system may also include a magnetic field generator configured to generate a magnetic field. The system may also include a magnetic etching ferrofluid containing one or more reverse micelles with a core containing an aqueous etchant solution and suspended in a non-polar solvent. The system may also include a controller. The controller may be configured to apply the magnetic etching ferrofluid onto the substrate at the first depth. The controller may be configured to send an instruction to the magnetic field generator to create the magnetic field at a first strength that causes the reverse micelle to move in a first direction at a first rate. The controller may be configured to receive the structure from the monitoring module. The controller may be configured to determine whether the substrate is at a second depth from the structure. The controller may be configured to send an instruction to the magnetic field generator to reduce, in response to the substrate being at the second depth, the magnetic field to a second strength to cause the reverse micelle to move in the first direction at a second rate.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 2A illustrates a diagram of an etching reverse micelle containing encapsulated magnetic particles, according to various embodiments.

FIG. 2B illustrates a simplified scheme of encapsulation of a magnetic particle, according to various embodiments.

FIG. 2C illustrates a magnified view of an etching reverse micelle containing encapsulated magnetic particles, according to various embodiments.

Figure 1B:
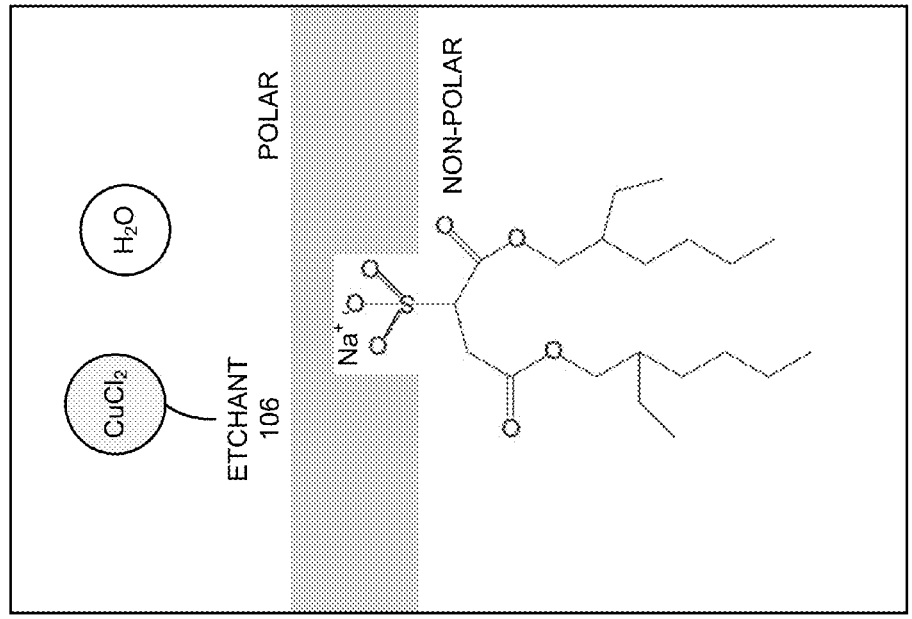
FIG. 1B illustrates a magnified view of an etching reverse micelle, according to various embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present disclosure relates to etching, and more specifically, to magnetically controllable etching. Aspects of the present invention may relate to magnetically controllable etching by applying a ferrofluid containing reverse micelles with an etchant solution onto a surface. The application of the ferrofluid may create a magnetic field that causes the ferrofluid to move to a target surface. Once the surface is etched to a desired level, it may be rinsed with a non-polar solvent and the ferrofluid may move in a different direction in response to a change in strength or location of the magnetic field. While the present disclosure is not necessarily limited to such applications, various aspects of the disclosure may be appreciated through a discussion of various examples using this context.

A ferrofluid is a liquid capable of being magnetized in the presence of a magnetic field. A ferrofluid may have magnetic particles and a liquid carrier. Examples of magnetic particles in a ferrofluid may include, but are not limited to, colloidal mixture of iron nanoparticles that may be finely divided and suspended in a liquid carrier. An example of a liquid carrier may include an oil compatible solvent that may be made up of a hydrocarbon such as isooctane.

A reverse micelle is an aggregate of surfactant molecules dispersed in a hydrophobic liquid, wherein the hydrophobic tail regions are in contact with the surrounding non-polar solvent (e.g., isooctane) while the hydrophilic head regions point towards the center of the reverse micelle. Examples of the surfactants molecules to form a reverse micelles may include, but are not limited to, polyisobutylene (PIB), acidic sorbitan oleate (SPAN), and sodium di(2-ethyl hexyl) sulfosuccinate (hereinafter "AOT"). The reverse micelle may be spherical in shape and may have a small spherical space pocket that may contain water and other polar molecules. Reverse micelles are attractive systems used for the confinement of polar nano-scale molecules, as they separate aqueous solution from a non-polar solvent by a surfactant layer.

Wet etching is predominantly isotropic in nature, consequently, the aspect ratio (i.e., the depth of line/line width) of the circuit lines is low. Unlike isotropic etching, in which etchants etch target material away uniformly in all directions, anisotropic wet etching allows etchants to etch target material in any direction. Anisotropic etching yields a much higher aspect ratio by limiting lateral etching and achieving much narrower circuit traces. In various embodiments, the capability of moving the ferrofluid to a target location in a desired direction, in response to a strength and/or location of a magnetic field, enables an magnetically controllable etching.

There may be one or more ways to prepare a ferrofluid that contains reverse micelles with an etching ability. In one embodiment, a ferrofluid may be created by adding reverse micelles containing etchants to a non-polar solvent where magnetic particles may be dispersed. A reverse micelle may have AOT as the surfactant; isooctane as a non-polar, oil-based solvent; and iron as magnetic particles. The non-polar groups of the surfactant may form the outer surface area of the spherical reverse micelle. For example, the hydrophilic head of AOT, i.e., the $Na^+$—$SO_3^-$ moiety, may point toward the center of the reverse micelle while the hydrophobic tail, i.e., the di-2-ethyl hexyl fragment, may point toward the non-polar, oil-based solvent. At the center of the reverse micelle, a core may be formed by being surrounded by the head groups of the reverse micelle. The core may be filled with a polar, aqueous solution carrying one or more etchants, e.g., cupric chloride, cupric sulfate, hydrogen peroxide, etc. The non-polar solvent may have finely divided magnetic particles in suspension, which may be magnetized in the presence of a magnetic field.

In another embodiment, a ferrofluid may be created by adding reverse micelles that contain both etchants and encapsulated magnetic particles to a non-polar solvent. The reverse micelles may have AOT as the surfactant; isooctane as a non-polar solvent; and iron as magnetic particles. A core of a reverse micelle may carry one or more etchants, e.g., cupric chloride, and encapsulated magnetic particles in aqueous solution. Encapsulated magnetic particles may be formed by enclosing non-polar magnetic particles by water-soluble encapsulants, e.g. hydroxyethylcellulose, ethylcelluose, etc. The newly formed encapsulated magnetic particles may not only possess a polar characteristic in the aqueous solution but also retain the ability to be magnetized in the presence of a magnetic field.

In various embodiments, reverse micelles may be dynamic structures, as they may constantly collide, coalesce, and exchange contents. Furthermore, contents of the aqueous solution inside the reverse micelle cores may be exchanged among many reverse micelles. During the exchange, one or more etchants, e.g., cupric chloride, in the core may exit the reverse micelle and reenter into the same reverse micelle or another in the surrounding. As one or more etchants exit the core of the reverse micelle, they may come in contact with a target material to be etched, e.g. copper, and etching may ensue. The dynamic characteristics of reverse micelles may enable the reverse micelles to function as etchants.

In addition to many other benefits, a method of wet etching with an electromagnetically-controllable ferrofluid may provide flexibility in working with a wider range of surface resistance. In various embodiments, the movement and direction of a ferrofluid containing etching reverse micelles may be controlled by a magnetic field. The method of applying electromagnetically-controllable wet etching process may be used to precisely tailor the electrical characteristics of a select few specific high-speed traces, wherein using conventional etching processes may make compromises between 50, 100 and 85 Ohm constructs, for example.

Figure 1A:
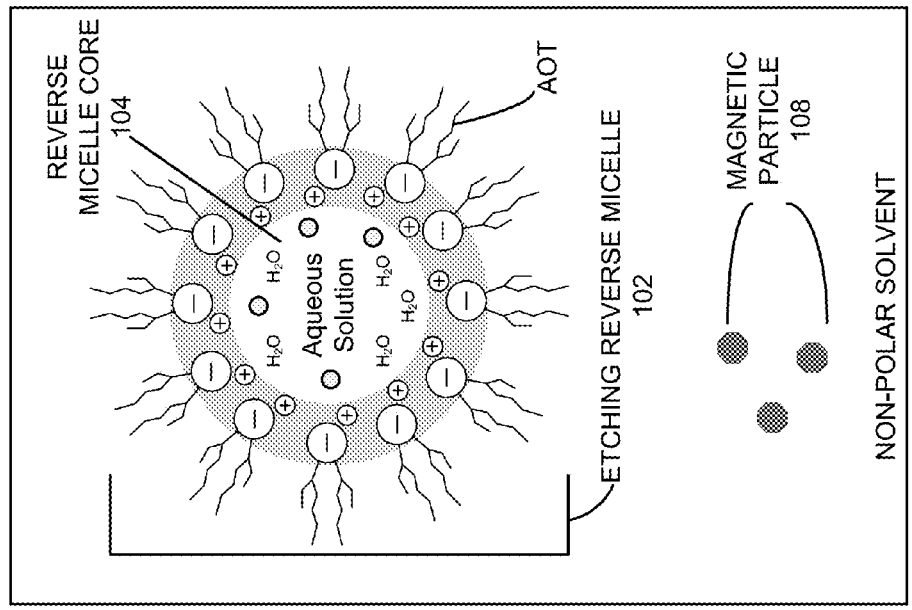
FIG. 1A illustrates a diagram of an etching reverse micelle, according to various embodiments.

FIG. 1A illustrates a diagram of an etching reverse micelle 102, according to various embodiments. An aggregate of surfactant, e.g., AOT, may form a spherical reverse micelle. A reverse micelle core 104 may be structured inside the etching reverse micelle 102 by the head groups of the surfactant, creating a space that may contain an aqueous solution. The reverse micelle core 104 may have a possible volume of 1.4 cubic millimeters-3.0 cubic millimeters. The reverse micelle core 104 may also have a diameter of 2-5 nm, according to various embodiments. The volume can be varied according to the degree of etching desired. For example, a greater need for etching may require a higher volume of aqueous solution. The etching reverse micelle 102 may be dispersed in a non-polar solvent, e.g. isooctane, wherein the non-polar solvent may contain magnetic particles 108 finely divided and suspended. The magnetic particles 108 may become magnetized in the presence of a magnetic field. Dispersing the magnetic particles in the non-polar solvent can be achieved by various ways, e.g., high shear dispersion, sonification, etc.

FIG. 1B illustrates a magnified view of an etching reverse micelle, according to various embodiments. Two layers, aqueous (polar) solution layer and non-polar solvent, divided by the head group of the surfactant, i.e., $Na^+$—$SO_3^-$ moieties of AOT, are viewed in the figure. The hydrophilic head of the surfactant may point toward the polar aqueous solution and the hydrophobic tail of the surfactant may point toward the non-polar solvent. The aqueous solution may contain etchant 106 dispersed in the solution with water. Cupric chloride, i.e., $CuCl_2$, may be used as etchant. The tail group of the surfactant, e.g., di-2-ethyl hexyl fragment of AOT may be dispersed in the non-polar solvent. In various embodiments, the concentration of the cupric chloride can be 125 g/L-175 g/L within the reverse-micelle core. The degree of etching preferred may be controllable based on the concentration of the etchant.

FIG. 2A illustrates a diagram of an etching reverse micelle 202 containing encapsulated magnetic particles, according to various embodiments. An aggregate of surfactant, e.g., AOT, may form a spherical reverse micelle. A reverse micelle core 210 may be created inside the etching reverse micelle 202 containing encapsulated magnetic particles by the head groups of the surfactant, creating a space that may contain an aqueous solution. The etching reverse micelle 202 containing encapsulated magnetic particles may be dispersed in a non-polar solvent, e.g. isooctane.

FIG. 2B illustrates a simplified scheme of encapsulation of a magnetic particle 208, according to various embodiments. The magnetic particle 208 may be encapsulated by an encapsulant 204, e.g. hydroxyethylcellulose, ethylcelluose, urea-formaldehyde, etc. to yield an encapsulated magnetic particle 206. A sample size diameter range for an encapsulant is 0.22-1000 micrometers. The encapsulated magnetic particle 206 may have an increased polarity, and may be in a stable state within the polar aqueous solution in a reverse micelle core 210. The encapsulated magnetic particles 206 may retain the ability to be magnetized in the presence of a magnetic field.

FIG. 2C illustrates a magnified view of an idealized diagram of an etching reverse micelle containing encapsulated magnetic particles 202, according to various embodiments. Two layers, aqueous (polar) solution layer and non-polar solvent, divided by the head groups of the surfactant, i.e., $Na^+$—$SO_3^-$ moieties of AOT, are viewed in the figure. The hydrophilic heads of the surfactant may point toward the polar aqueous solution and the hydrophobic tails of the surfactant may point toward the non-polar solvent. The aqueous solution may contain etchant 212 dispersed in the solution with water. In various embodiments, cupric chloride may be used as the etchant. The aqueous solution may further contain one or more encapsulated magnetic particles 206. The tail groups of the surfactant, e.g., di-2-ethyl hexyl fragments of AOT, may be dispersed in the non-polar solvent.

Figure 3A:
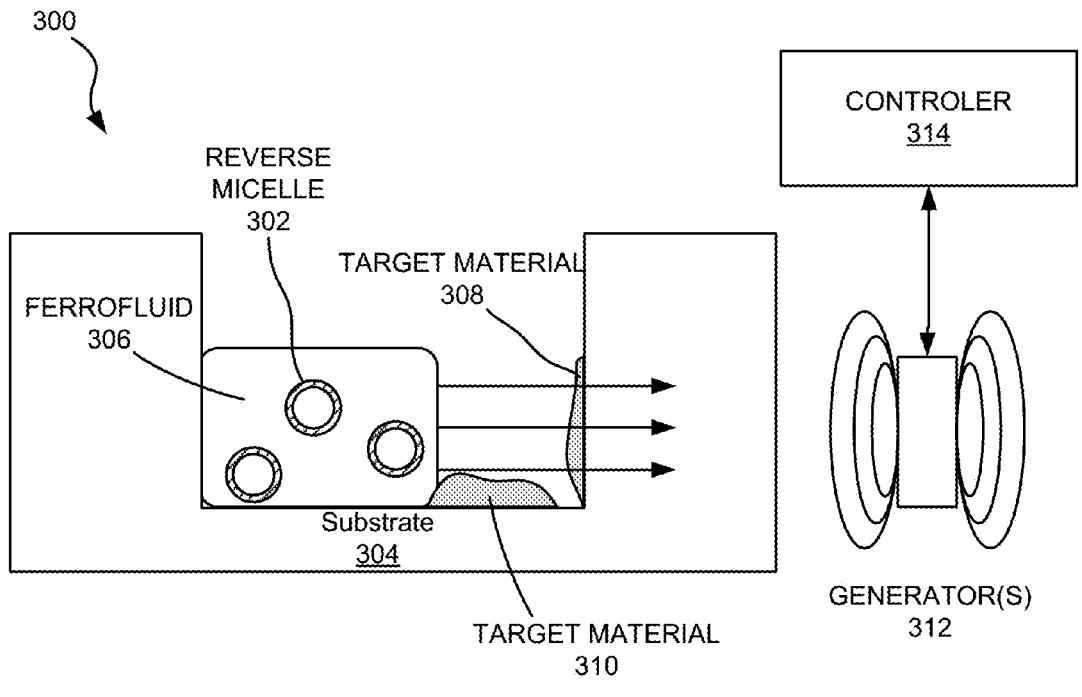
FIG. 3A illustrates a schematic diagram of a system for controlling a ferrofluid containing one or more reverse micelles, according to various embodiments.

FIG. 3A illustrates a schematic diagram of a system 300 for controlling a ferrofluid 306 containing one or more reverse micelles 302, according to various embodiments. The reverse micelles 302 may be in a sufficient concentration to etch the target material 308 and 310 and may vary depending on the amount of target material to be removed. In various embodiments, the ferrofluid 306 may contain dispersed magnetic particles. The reverse micelles 302 dispersed in the ferrofluid 306 may contain one or more etchants. In various embodiments, the reverse micelles 302 may also contain encapsulated magnetic particles, e.g., the magnetic particles found in FIG. 2B.

The ferrofluid 306 containing one or reverse micelles 302 may be applied onto a substrate 304, wherein the substrate 304 may have target materials 308, 310 to be etched. Target materials may exist on the bottom or sidewall of the substrate 304 as illustrated in FIG. 3A. The system 300 further illustrates an application of a magnetic field to the inserted ferrofluid 306 containing one or more reverse micelles 302. Once the ferrofluid containing one or more reverse micelles 302 is inserted into a substrate 304, a magnetic field may be applied to the ferrofluid. In various embodiments, a spherical droplet containing the reverse micelle may split into two conical daughter droplets and the magnetic field may have a field intensity range from 80-680 Oersteds (Oe). The magnetic field may have minimal interaction with the circuit components.

The system 300 may have a generator 312, a monitoring module 313, and a controller 314. The monitoring module 313 can operate on visual feedback, such as microscopy, Infrared Imaging, x-ray spectroscopy, or any other technique used to determine the structure of the substrate. The system 300 may operate in a feedback loop. For example, the monitoring module 313 can determine how the substrate 304 is structured against an expected result. The monitoring module 313 can feed the structural information to the controller 314. The controller 314 can control the magnetic field generated by the generator 312. The magnetic field may be created by a generator 312, and a controller 314 may control the location, movement, and proximity of the magnetic field which further is captured by the monitoring module.

In various embodiments, the controller 314 may adjust the magnetic field to cause the reverse micelle to move in a second direction. For example, if the target material 310 is not etched sufficiently, the controller 314 may adjust the magnetic field produced by the generator 312 to etch the target material. The adjustment can include a change in the direction or intensity of the magnetic field. For example, if the direction of the magnetic field is changed, then the generator 312 may be moved relative to the substrate 304.

Figure 3B:
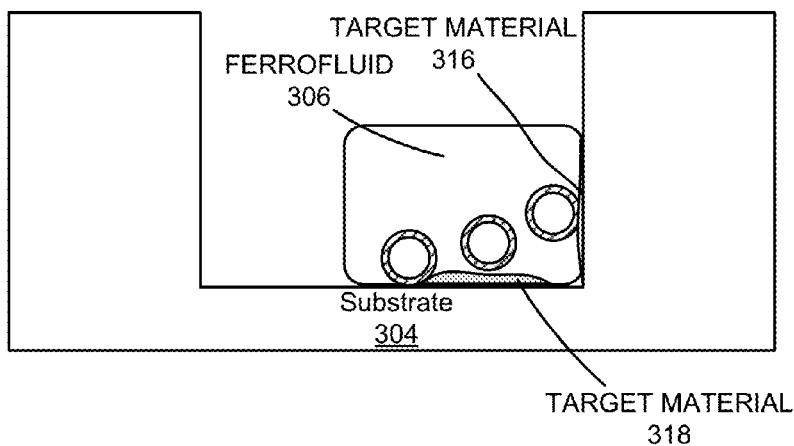
FIG. 3B illustrates a diagram of a system for wet etching a substrate layer, according to various embodiments.

FIG. 3B illustrates a diagram of a system 350 for wet etching a substrate layer, according to various embodiments. Once a ferrofluid 306 containing one or more etchants is applied to target materials, magnetically controllable etching may begin to function due to the dynamic characteristic of the etching reverse micelle. In various embodiments, reverse micelles dispersed in the ferrofluid 306 may carry etchants with the capability of wet etching anisotropically, e.g., cupric chloride. The etchants may come in contact with the target materials 316, 318 and may immediately start etching anisotropically. The target materials 316 and 318, which may correspond to the target material 308 and 310, respectively, in FIG. 3A., may be etched away and reduced in size.

The movement and direction of the ferrofluid may respond to and vary in accordance with the location and proximity of the magnetic field. A change in the movement of the ferrofluid may be initiated in response to a change in location of the magnetic field, and the ferrofluid may consequently change its location toward the magnetic field. Also, the speed at which the ferrofluid may move may vary according to the proximity in distance of the magnetic field. Upon being applied by the magnetic field, magnetic particles 308 in the ferrofluid may get attracted to the magnetic field, causing the movement of the ferrofluid in a direction towards the magnetic field. The closer the magnetic field is applied to a ferrofluid, the stronger magnetic particles 306 in the ferrofluid may get attracted to the magnetic field, causing faster movement of the ferrofluid.

Figure 4:
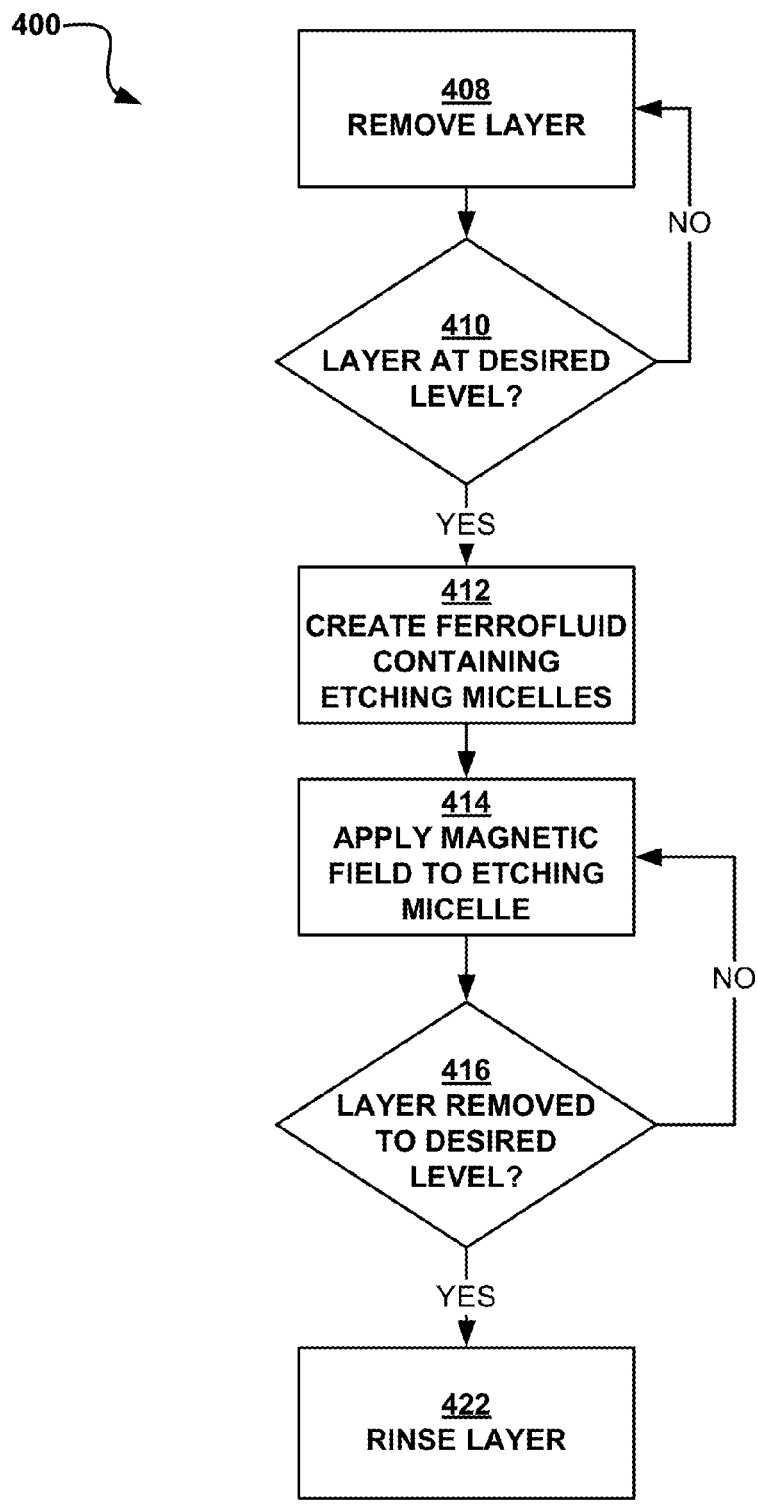
FIG. 4 illustrates a flowchart for a method for magnetically controllable etching with a ferrofluid containing etching reverse micelles, according to various embodiments.

FIG. 4 illustrates a flowchart for a method 400 for magnetically controllable etching with a ferrofluid containing etching reverse micelles, according to various embodiments. At operation 408, a ferrofluid containing etching reverse micelles may be applied to a substrate layer to etch target materials and the substrate layer may be removed to a desired level for applying a ferrofluid containing reverse micelles. Due to a relatively slow speed, the method of etching with a ferrofluid containing etching reverse micelles may be used after nominal lines or spaces are fabricated on a substrate. Removing the substrate layer to a desired level may be achieved by using various etching processes, e.g., the spray etch process used in the manufacture of printed circuit boards.

At operation 410, the controller may determine whether the substrate is at a first depth. The controller may utilize a form of detection mechanism such as optical sensors. The first depth of substrate for applying magnetic etching micelles may be user-defined. In various embodiments, the first depth can be at a desired level. The first depth may be met if the determined level is equal to the desired level or falls within a threshold value. If the first depth is not met, then the method 400 may continue to operation 408 to further reduce the substrate in order to meet the first depth. If the first depth is met, then the method 400 may proceed to operation 412.

At operation 412, a ferrofluid containing etching reverse micelles is created. In one embodiment, a ferrofluid may carry etching reverse micelles containing etchants with the magnetically controllable etching capability, e.g., cupric chloride, and magnetic particles in a non-polar solvent. In another embodiment, a ferrofluid may carry etching reverse micelles containing etchants with the magnetically controllable etching capability and encapsulated magnetic particles, both of which may be contained inside their polar core.

At operation 414, a magnetic field may be applied to a ferrofluid carrying one or more etching reverse micelles. A magnetic field may be generated by a magnetic field generator. The movement and direction of the ferrofluid may respond to the location of the magnetic field, i.e., the direction and distance of the magnetic field being applied to the ferrofluid. The location of the magnetic field may also be manipulated by changing the strength or the location of the magnetic field generator.

At operation 416, the controller may determine whether the target substrate is removed to a second layer. The controller may first determine the amount of substrate that is remaining. The controller may also determine if the amount of substrate is within a tolerance for the second layer. The second layer may be user-defined. In various embodiments, the second layer may be met if the second layer is equal to or less than the determined layer of the substrate. If the second layer is not met, then the method 400 may continue to operation 414 to further etch the target material in order to meet the second layer. If the second layer of the substrate is met, then the method 400 may proceed to operation 422. In various embodiments, the controller may reduce the magnetic field to cause the reverse micelle to move at a second rate. The second rate can also include non-movement of the reverse micelle relative to the substrate. For example, once the controller determines the substrate is removed to a second layer, then the controller can cause the magnetic field generator to cease.

At operation 422, a substrate in a finished circuit board may be rinsed using various rinsing methods. For example, the substrate may be rinsed with the solvent of the ferrofluid (e.g., isooctane) containing etching reverse micelles in various embodiments. The substrate may also be rinsed with an aqueous detergent followed by a de-ionized water (DI-water) cleaning.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, an engine, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for magnetically controllable etching a substrate comprising:
    applying a magnetic etching ferrofluid, that contains an aqueous etchant solution within one or more reverse micelles responsive to a magnetic field, onto the substrate at a first depth;
    creating a magnetic field at a first strength that causes the reverse micelle to move in a first direction at a first rate;
    determining whether the substrate is at a second depth; and
    reducing, in response to the substrate being at the second depth, the magnetic field to a second strength to cause the reverse micelle to move in the first direction at a second rate.

2. The method of claim 1, wherein the second rate includes non-movement of the reverse micelle.

3. The method of claim 1, further comprising:
    adjusting the magnetic field to cause the reverse micelle to move in a second direction.

4. The method of claim 1, further comprising:
    increasing, in response to the substrate being at a depth other than the second depth, the magnetic field to a third strength cause the reverse micelle to move in the first direction at a third rate.

5. The method of claim 4, further comprising:
    adding iron nanoparticles in the magnetic etching ferrofluid to cause the reverse micelle to move in the first direction at a fourth rate.

6. The method of claim 1, wherein the magnetic etching ferrofluid includes a liquid carrier of a non-polar solvent.

7. The method of claim 6, wherein the magnetic etching ferrofluid includes an iron nanoparticle suspended in the liquid carrier.

8. The method of claim 6, wherein the non-polar solvent includes isooctane.

9. The method of claim 1, wherein the aqueous etchant solution has a volume of 1.4 cubic millimeters-3.0 cubic millimeters.

10. The method of claim 1, wherein the aqueous etchant solution contains encapsulated iron nanoparticles.

11. The method of claim 1, wherein the substrate includes copper.

12. The method of claim 1, wherein the aqueous etchant solution includes copper chloride with a concentration of 125 g/L-175 g/L.

13. The method of claim 1, further comprising:
    removing a portion of the substrate to the first depth, wherein applying the magnetic etching ferrofluid occurs responsive to the first depth.

14. The method of claim 1, further comprising:
    rinsing the second depth of the substrate with a non-polar solvent.

* * * * *